United States Patent [19]

Grube et al.

[11] 3,947,757

[45] Mar. 30, 1976

[54] VOLTAGE REGULATOR TESTER

[76] Inventors: Donald B. Grube; Juan C. Grube; James A. Grube, all of 1220 E. 58th Hwy., Raymore, Mo. 64083

[22] Filed: Feb. 24, 1975

[21] Appl. No.: 552,441

[52] U.S. Cl............................ 324/28 R; 324/158 R
[51] Int. Cl.² ........................................ G01R 31/02
[58] Field of Search............. 324/28 R, 158 R, 73 R

[56] References Cited
UNITED STATES PATENTS

| | | | |
|---|---|---|---|
| 3,142,797 | 7/1964 | Grant................................ | 324/28 R |
| 3,437,916 | 4/1969 | Mazurkevics...................... | 324/28 R |

Primary Examiner—R. V. Rolinec
Assistant Examiner—Michael J. Tokar
Attorney, Agent, or Firm—Fishburn, Gold & Litman

[57] ABSTRACT

A test circuit for automotive voltage regulators includes means for simulating transient battery voltages, a meter for monitoring these voltages as related to the operation of the regulator being tested, switching means to protect the meter and also to facilitate the reading thereof, a test load simulating the field coil of an automotive alternator, and an indicator light for determining when the test load is energized. The volt meter indicator moves to show increasing voltage and returns to zero when the regulator interrupts the current to the test load.

11 Claims, 5 Drawing Figures

VOLTAGE REGULATOR TESTER

The present invention relates to improvements in instruments used for testing automotive voltage regulators. In modern automotive vehicles, self-rectifying A.C. generators, called alternators, are used to replenish the potential of batteries exhausted or reduced by the use of the electrical components of the vehicle. The alternator is equipped with a field coil on its rotor which increases or decreases the voltage output of the alternator depending on the manner in which it is energized. Also, the voltage output of the alternator is affected by the speed at which it is rotated. The voltage regulator is designed to maintain a substantially constant battery voltage output by energizing the alternator field when the battery voltage drops below a desired level and by de-energizing the alternator field when the battery is recharged.

When there is a malfunction in the electrical system of an automobile, the faulty component must be determined and subsequently repaired or replaced. Voltage regulators are generally sealed, self-contained units that cannot be repaired, but must be replaced if defective. Various instruments have been devised to test voltage regulators, however, most fall short of optimum performance.

In testing a voltage regulator, it is desirable to determine first, if the regulator is switching on and off and second, if the regulator is switching in the voltage range for which it is designed. The regulator tester of the present invention, employs a test load which includes an indicator light; so it is a simple matter to determine if the regulator is switching. Past testers employed a volt-meter across the output of the power supply and a rheostat in series with one side of the power supply and when the regulator interrupts the current to the load, the meter than reads the full power supply voltage, there being no current drawn by the regulator and, therefore, substantially no voltage drop across the rheostat. This arrangement not only puts a strain on the volt-meter, but also makes it difficult to take accurate readings, since it is necessary to notice the voltage reading just before the needle jumps from the voltage at cutoff to the pole at the maximum reading of the meter.

In addition, past voltage regulator testers have supplied regulators with currents substantially lower than their designed capabilities, which did not give a true indication of the regulator's ability to perform under operational conditions. Further, some regulators will not operate when out of their normal circuits, and past inventions had no means of supplying the missing conditions, making tests of these regulators impossible.

The principal objects of the present invention are: to provide a voltage regulator tester which overcomes the aforementioned difficulties; to provide such a tester having a circuit for testing automotive voltage regulators which includes a test load that draws an amount of electrical current comparable to the amount drawn by the alternator field coil with which the regulator is normally used, thereby giving a true indication of the regulator's performance; to provide a circuit of such configuration that accurate voltage readings and the cut-off voltage are easily taken or observed; to provide such a circuit of which the components thereof are not subjected to severe strain; to provide a circuit capable of testing a great variety of automotive voltage regulators; to provide a voltage regulator tester which is economical to manufacture, accurate, versatile, and durable in use, and which is particularly well adapted for its intended use.

Other objects and advantages of the present invention will become apparent from the following description taken in connection with the accompanying drawings wherein are set forth by way of illustration and example certain embodiments of this invention.

The drawings constitute a part of this specification and includes an exemplary embodiment of the present invention and illustrate various objects and features of the voltage regulator tester.

Figure 1:
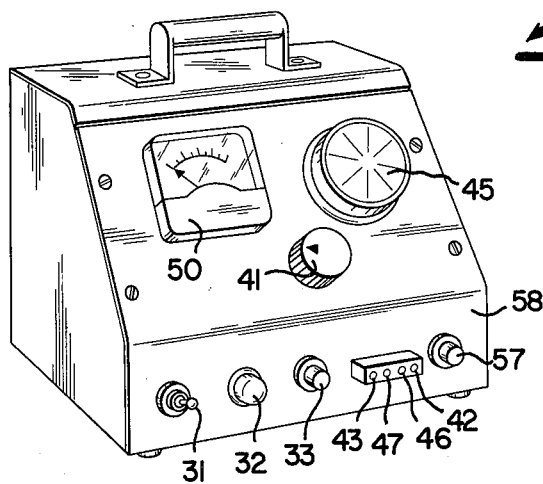
FIG. 1 is a perspective view of a voltage regulator test instrument employing the present invention.
Figure 2:
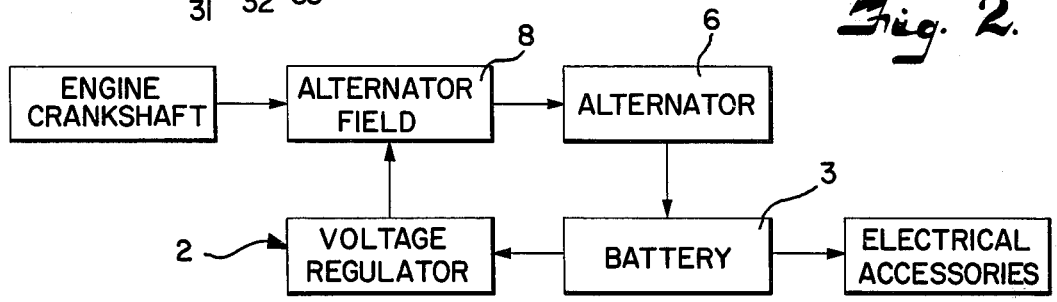
FIG. 2 is a simplified block diagram of an automotive electrical system.

Referring more in detail to the drawings:

As required, detailed embodiments of the present invention are disclosed herein. However, it is to be understood that the disclosed embodiments are merely exemplary of the invention which may be embodied in various forms. Therefore, specific structural and functional details disclosed herein are not to be interpreted as limiting but merely as a basis for the claims and as a representative basis for teaching one skilled in the art to variously employ the present invention in virtually any appropriately detailed structure.

In the disclosed embodiment of the present invention, the reference numeral 1 generally designates a voltage regulator tester adapted to ascertain the operability of automotive voltage regulators 2. In an automotive electrical system, a battery 3 supplies current to the electrical accessories of a vehicle. Use of accessories, including the starter, spark plugs, lights, signals, etc., drains away the electrical potential of battery 3; therefore, an alternator 6, driven by the engine crank shaft, is employed to replenish the lost potential.

In the alternator 6, alternating current is generated by the interaction between the stator windings and the magnetism created by current flowing in the field winding 8 of the rotor. Direct current for the field winding 8 is supplied by the battery 3 through the voltage regulator 2 when the voltage regulator 2 senses that the battery potential has dropped below a selected level. The alternator 6 contains rectifiers (not shown) which convert its A.C. output to D.C. which is fed to the battery 3.

Figure 3:
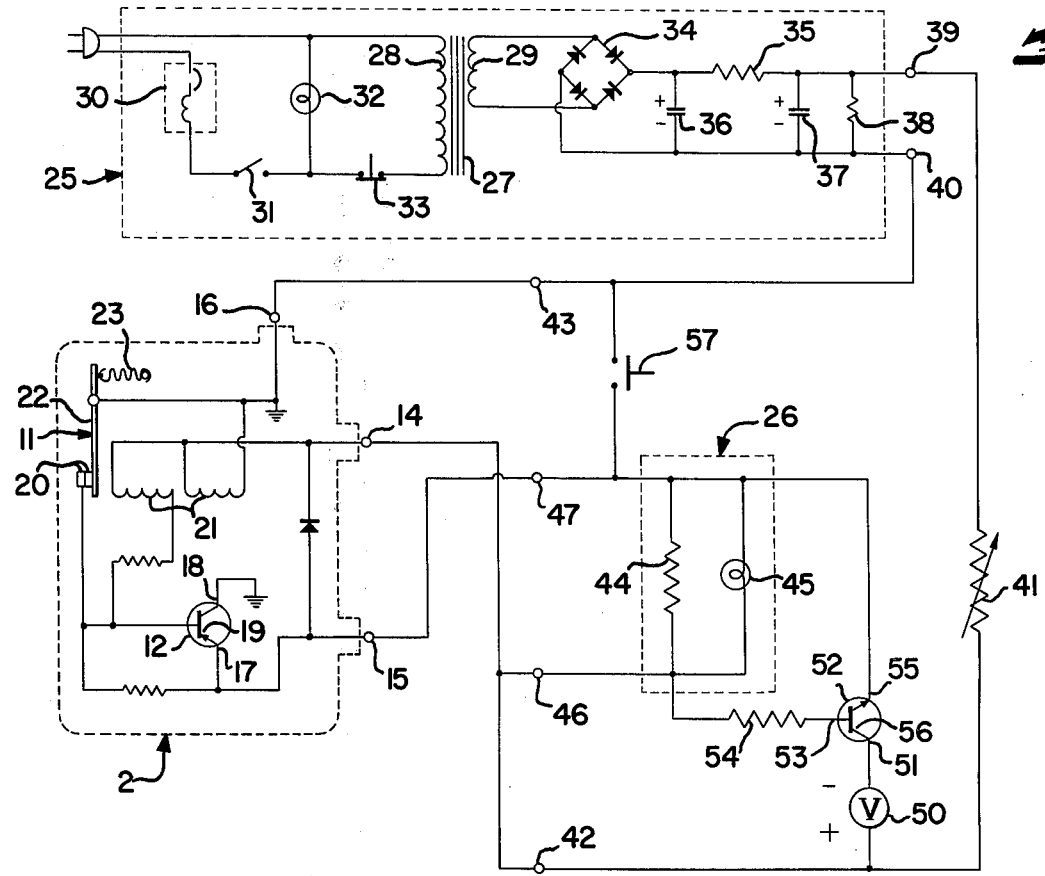
FIG. 3 is a circuit diagram of the voltage regulator tester connected to a typical automotive voltage regulator.

A typical voltage regulator 2, see FIG. 3, comprises a relay 11 and a transistor 12, illustrated as a PNP type transistor. In normal operation, the positive side of battery 3 is connected to regulator terminal 14, with the negative side of battery 3 connected to the ground 16 of regulator 2 through the frame of the vehicle. The alternator field coil 8 is connected to regulator terminals 14 and 15; therefore, in the illustrated regulator 2, one side of the alternator field 8 is connected to the positive battery potential at regulator terminal 14. The alternator field circuit is completed through the emitter 17 and collector 18 of the transistor 12 when the base-emitter bias is accomplished through normally closed relay contacts 20 to ground 16. In this condition, the battery 3 is supplying current to the alternator field 8.

As battery potential builds up, a level is reached at which the magnetic pull exerted by relay windings 21 on relay armature 22 overcomes the tension of spring 23 whereupon contacts 20 separate. When this happens the base-emitter junction 19 is no longer forward biased, therefore, the emitter-collector circuit of transistor 12 is open and, with it, current to the alternator field 8 is interrupted.

As with all electromechanical devices, voltage regulators 2 are likely to develop malfunctions after a period of use. Since voltage regulators are not generally repairable, a means is necessary to test them when malfunctions are suspected. FIG. 3 is a circuit diagram of an improved voltage regulator tester. In general, the test circuit 1 is adapted to simulate the normal environment of a voltage regulator 2 with D.C. power supply 25 substituting for the battery 3 and with a test load 26 replacing the alternator field 8.

The power supply 25 is a conventional D.C. power supply adapted to convert 110 volt alternating current to lower voltage direct current. The power supply 25 includes power transformer 27 operative to convert 110 volts A.C. received at the primary winding 28 to 24 volts A.C. at the secondary winding 29. Also included in the primary circuit are series connected circuit breaker 30 and on-off switch 31, parallel connected pilot light 32, and series connected, normally closed, push button reset switch 33. The secondary winding 29 is connected to a full-wave bridge rectifier 34 whose output is then fed to a pi-network filter containing a resistor 35 and electrolytic capacitors 36 and 37. A bleeder resistor 38 is connected in parallel with capacitor 37. The voltage measured at respective positive and negative terminals 39 and 40 of power supply 25 is approximately 24 volts direct current.

In the tester, a rheostat 41 is connected between positive supply terminal 39 and tester terminal 42. In the illustrated embodiment, rheostat 41 has a value of 50 ohms and a power capacity of 50 watts. Rheostat 41 is operative to vary the voltage measured at respective positive and negative tester terminals 42 and 43.

The voltage regulator tester 1 includes a test load 26 adapted to simulate an alternator field coil for the purpose of testing voltage regulators. The test load 26 includes a resistor 44 and an incandescent lamp 45 connected in parallel with resistor 44. In the illustrated circuit, resistor 44 has a value of 25 ohms and a power capacity of 12 watts. The lamp 45 is adapted to light up when test load 26 is energized and to extinguish when the test load 26 is no longer supplied with current. The test load 26 is connected to tester terminals 46 and 47.

In order to monitor the voltage output of power supply 25 as adjusted by rheostat 41, a D.C. volt meter 50 is employed with the positive side thereof connected to tester terminal 42 and with the negative side thereof connected to the collector 51 of an NPN transistor 52. The base 53 of transistor 52 is connected through a resistor 54 to tester terminal 46. In the illustrated circuit, resistor 54 has a value of 10,000 ohms and a power capacity of ¼ watt. The emitter 55 of transistor 52 is connected to tester terminal 47. When the test load 26 is carrying current, the base emitter junction 56 of transistor 52 is forward biased, and a voltage appears at the collector 51 of transistor 52, as will be explained later. When the test load 26 is not carrying current, the base emitter junction 56 is not forward biased, and no voltage appears at the collector 51. With this arrangement, voltage readings may be taken only when the test load 26 is energized.

In order to use voltage regulator tester 1 to test a voltage regulator 2, the regulator is removed from the automotive circuit and tester terminal 42 is connected to regulator terminal 14 and tester terminal 43 is connected to regulator ground terminal 16. Tester terminal 46 is also connected to regulator terminal 14 and tester terminal 47 is connected to regulator terminal 15. Rheostat 41 is adjusted to maximum resistance to start with, and switch 31 is closed. If the regulator 2 is operating properly, as soon as switch 31 is closed, lamp 45 should light up, indicating that regulator 2 is supplying current to test load 26.

The resistance of rheostat 41 is then decreased slowly until the meter 50 reads approximately 14 volts, at which level, the magnetism created by windings 21 of relay 11 acting on the armature 22 thereof overcomes the tension of spring 23 thereby opening contacts 20. With contacts 20 open, there is no forward bias on the base-emitter junction 19 of transistor 12, and consequently, no current can flow through the collector 17 and the emitter 18 of transistor 12, and the test load 26 is thereby de-energized.

When the test load 26 is energized, the negative connection to volt meter 50 is completed through the collector 51 and the emitter 55 of transistor 52 and through the emitter 17 and the collector 18 of transistor 12 to the ground connection 16 of regulator 2 and thereby to the negative terminal 40 of the power supply 25. However, when contacts 20 open, transistor 12 is shut off thereby de-energizing the test load 26, whereupon transistor 52 is shut off and the needle of meter 50 drops to zero. In practice the regulator is connected in circuit with the tester and the rheostat gradually moved to increase the voltage until the regulator cuts off the charge and thereupon the voltage meter indicator or hand that has been gradually advancing on the dial drops back to zero. This stopping and reversal of direction of the indicator is easily observable.

If lamp 45 does not light up when switch 31 is closed, or if the lamp 45 does not go out at the proper voltage, the regulator is judged defective.

In a certain type of voltage regulator, excluding the illustrated regulator 2, certain circuits require completion before the regulator can function. Therefore, a push button, normally open switch 57 is connected between tester terminals 47 and 43 to thereby render this type of regulator operable.

In order to facilitate the use of tester 1 as a shop instrument, the components of the tester 1 are enclosed in a protective cabinet 58.

Figure 4:
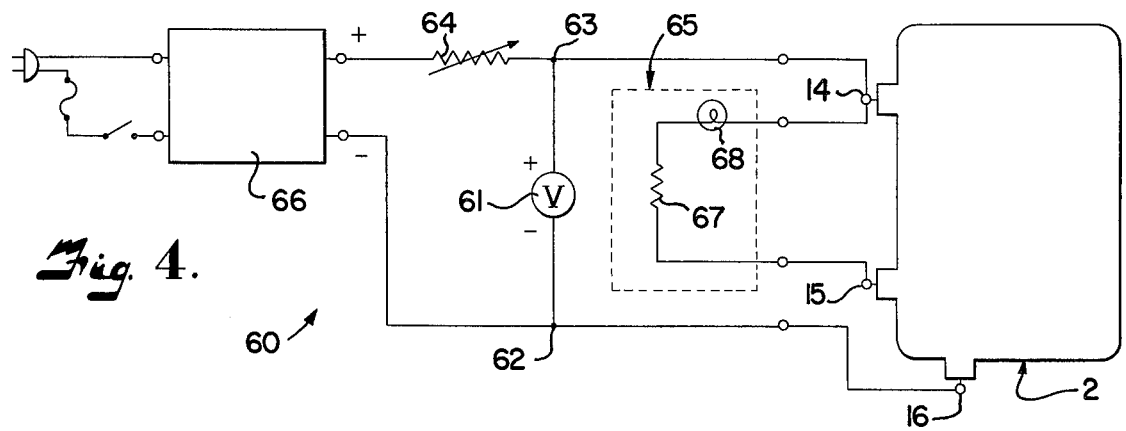
FIG. 4 is a circuit diagram of a conventional voltage regulator tester of which the present invention is an improvement.

The voltage regulator 1 described above is an improvement over a prior tester 60, see FIG. 4. In the prior tester, a volt meter 61 is connected between terminals 62 and 63. As the cut-off voltage of the regulator 2 is reached, by adjusting the rheostat 64, the meter 61 reads the voltage across terminals 62 and 63, as current is supplied to the test load 65. The meter indicator gradually advances and when the regulator 2 turns off, thereby shutting off current to the test load 65, the indicator continues in a quick advance to a limit. Since there is no current drawn through rheostat 64, there is no voltage drop thereacross, and the meter immediately reads the full voltage output of the power supply 60. This sudden increase in the meter reading greatly hinders the determination of the cut-off voltage of the regulator 2 and also puts a strain on the movement of the meter 61.

The test load 65 is a series connection of a resistor 67 of 10 ohms and incandescent lamp 68. The current drawn by the test load 65 is, therefore, substantially less than the current drawn by the parallel connection of resistor 44 and lamp 45 of the tester 1. With the greater current drawn by the test load 26 of tester 1, the regulator 2 is more rigorously tested. The improved voltage regulator tester 1 is, therefore, a more reliable instrument for testing automotive voltage regulators.

Most modern automobile electrical systems incorporate 12 volt batteries along with electrical components designed for use therewith. However, there exist systems which operate at voltages other than 12 volts, including various trucks, aircraft and auxiliary power and refrigeration units, etc. It is desirable to have a tester for testing voltage regulators used in these systems.

Figure 5:
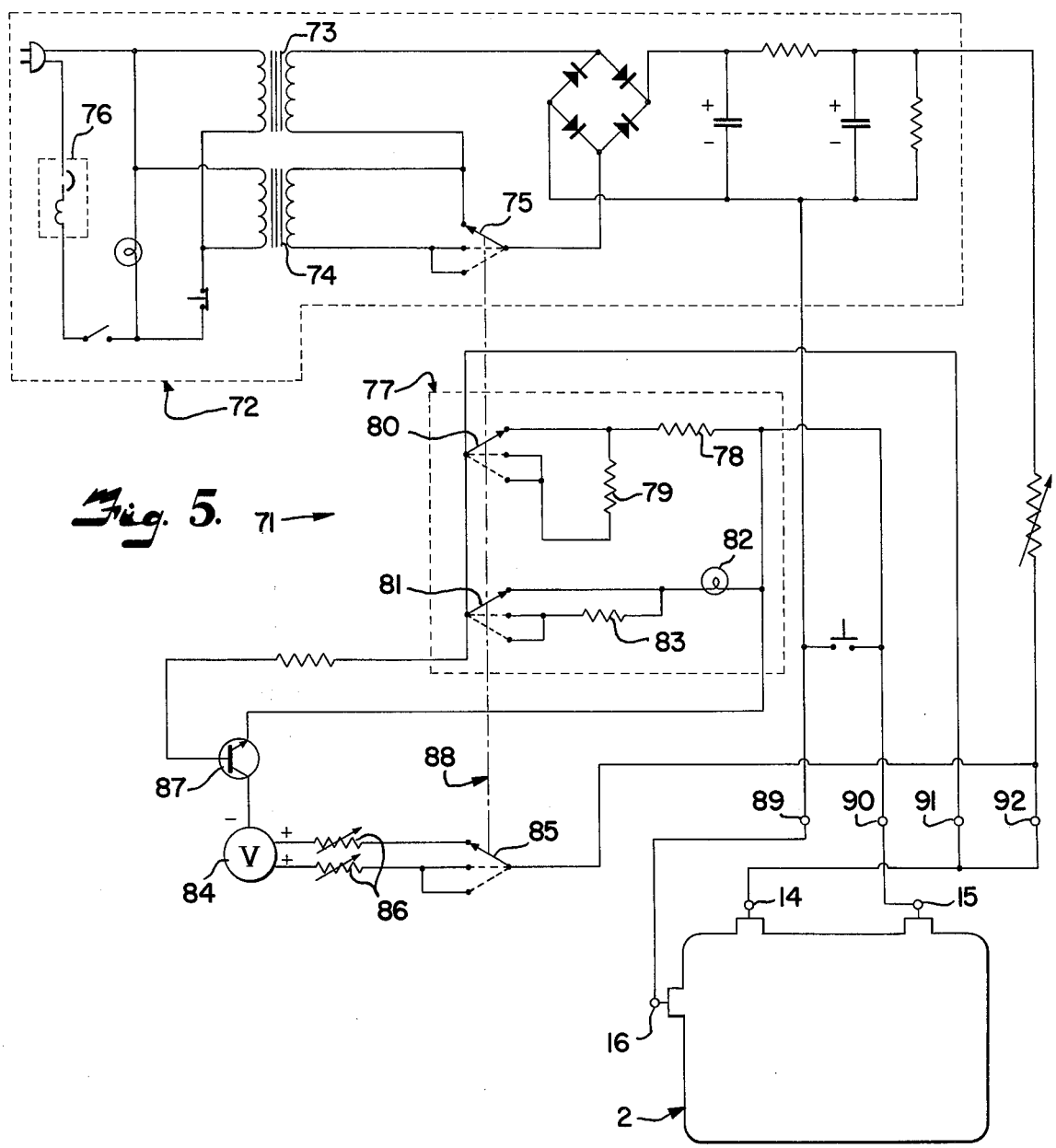
FIG. 5 is a circuit diagram of a modified form of the voltage regulator tester.

FIG. 5 illustrates a modified voltage regulator test circuit 71 adapted to test voltage regulators which operate at 12, 24, 30 and 32 volts. Tester 71 is substantially similar to tester 1 in construction and operation. Modifications include means for selecting appropriate test voltages and test load components and a selectable range, dual scale volt-meter for monitoring test operations.

In the power supply 72 of tester 71, identical transformers 73 and 74 each have a secondary voltage of 25 volts when supplied with 110 volts A.C. at their respective primaries. The primary windings of transformers 73 and 74 are connected in parallel while their secondary windings are connected in series. When switch 75 is in the upper position, as illustrated in FIG. 5, transformer 73 only is used, with its 25 volt output available for testing 12 volt regulators. When switch 75 is in the other positions, illustrated as a middle and a lower position, the combined outputs of transformers 73 and 74 result in a total of 50 volts available for testing 24, 30, and 32 volt regulators. Transformers 73 and 74 are each similar to transformer 27 of tester 1. Circuit breaker 76 has twice the current capacity of circuit breaker 30 of tester 1 to thereby handle greater currents required in testing larger regulators. The remaining components of power supply 72 are substantially similar to corresponding components in tester 1.

Test load 77 includes resistors 78 and 79 which are connected in series. Resistors 78 and 79 are each identical to resistor 44 of tester 1. When switch 80 is in the upper position, as illustrated in FIG. 5, resistor 78 only is selected for testing 12 volt regulators. When switch 80 is in the positions illustrated as a middle and a lower position, both resistors 78 and 79 are selected for testing 24, 30 and 32 volt regulators. The illustrated upper position of switch 81 selects test lamp 82 only for determining when a 12 volt regulator is supplying current to the test load 77. The illustrated middle and lower positions of switch 81 connect a 75 ohm, 12 watt resistor 83 in series with lamp 82 to thereby protect lamp 82 from excessive voltages when testing 24, 30 and 32 volt regulators.

Volt-meter 84 is a dual scale volt-meter for monitoring the adjustable output voltage of power supply 72. The illustrated upper position of switch 85 selects a 0–20 volt scale of meter 84 while the illustrated middle and lower positions of switch 85 select a 0–50 volt scale thereof. Potentiometers 86 are operative to correct the indicator of meter 84 at zero voltage as is sometimes necessary when using multi-scaled meters. The connection of meter 84 in the circuit is substantially similar to the connection of volt-meter 50 of tester, with the negative connection of meter 84 through transistor 87 allowing the indicator of meter 87 to return to zero when the regulator being tested interrupts the current to test load 77.

It can be observed from FIG. 5 that the illustrated middle and lower positions of respective switches 75, 80, 81, and 85 are electrically identical. The illustrated middle positions are selected for testing 24 bolt regulators while the illustrated lower positions are used for testing 30 and 32 volt regulators. The purpose for using different switch positions that are electrically the same is to alert the test operator to the different operating and cutoff voltages involved to thereby insure accurate testing of the respective regulators. In practice, switches 75, 80, 81, and 85 are combined in a single 4-pole, 3-position rotary switch 88.

The connection of tester 71 to a typical regulator 2 is similar to the connection of tester 1 thereto. Terminal 89 is connected to regulator ground 16; tester terminal 90 is connected to regulator field terminal 15; and tester terminals 91 and 92 are connected to regulator battery terminal 14.

Operation of tester 71 is substantially similar to the operation of tester 1 except that the illustrated upper position of rotary switch 88 must be selected for 12 volt regulators, the illustrated middle position for 24 volt regulators, and the illustrated lower position for 30 and 32 volt regulators.

It is to be understood that while we have illustrated and described certain forms of our invention, it is not to be limited to the specific form or arrangement of parts herein described and shown.

What we claim and desire to secure by letters Patent is:

1. A voltage regulator tester for testing automotive voltage regulators comprising:
   a. an adjustable direct current power source;
   b. a circuit connected to the power source and including a volt-meter for monitoring the adjusted voltage output level of said power source, said circuit having terminals connecting a voltage regulator to be tested thereto;
   c. a test load in the circuit for simulating the field coil of an automotive alternator with which a voltage regulator to be tested is normally used;
   d. a lamp in the circuit for indicating the presence of electrical current in said test load when energized; and
   e. automatic switching means in the circuit to connect said volt-meter to said test load when said regulator is supplying electrical current thereto and to disconnect said volt-meter when the supply of current to said test load is interrupted by the voltage regulator.

2. A voltage regulator tester as set forth in claim 1 wherein said test load comprises a resistor of selected resistance and wherein said lamp is connected in parallel with said resistor to thereby increase the electrical current drawn through said regulator.

3. A voltage regulator tester as set forth in claim 1 wherein said automatic switching means comprises a transistor circuit.

4. A voltage regulator tester as set forth in claim 1 wherein a means is provided for completing certain peripheral circuits of a type of automotive voltage reg-